(12) United States Patent
Nien et al.

(10) Patent No.: US 7,435,954 B2
(45) Date of Patent: Oct. 14, 2008

(54) ELECTRON MICROSCOPE, METHODS TO DETERMINE THE CONTACT POINT AND THE CONTACT OF THE PROBE

(75) Inventors: Cheng-Hsun Nien, Taipei (TW); Chuen-Horng Tsai, Hsinchu (TW); Kun-Ying Shin, Hsinchu (TW); Wen-Bin Jian, Hsinchu (TW)

(73) Assignee: National Central University, Taoyuan (TW)

( * ) Notice: Subject to any disclaimer, the term of this patent is extended or adjusted under 35 U.S.C. 154(b) by 290 days.

(21) Appl. No.: 11/459,359

(22) Filed: Jul. 23, 2006

(65) Prior Publication Data

US 2007/0262254 A1 Nov. 15, 2007

(30) Foreign Application Priority Data

May 11, 2006 (TW) .............................. 95116721 A

(51) Int. Cl.
*H01J 37/26* (2006.01)
*H01J 37/20* (2006.01)
(52) U.S. Cl. ........................ 250/306; 250/307; 250/310; 250/311
(58) Field of Classification Search ................. 250/306, 250/307, 310, 311
See application file for complete search history.

(56) References Cited

U.S. PATENT DOCUMENTS 6,828,571 B1 * 12/2004 McCord et al. .......... 250/492.2
6,930,309 B1 * 8/2005 Mankos et al. .............. 250/310
6,979,822 B1 * 12/2005 Stewart et al. .............. 250/310

OTHER PUBLICATIONS

Kim, et al., In situ manipulation and characterizations using nanomanipulators inside a field emission-scanning electron microscope, Review of Scientific Instrumnets, Sep. 2003, p. 4021-4025, vol. 74, No. 9 American Institute of Physics.
Methods of determining the contact between a probe and a surface under scanning electron microscopy by C.-H. Nien et al., Review of Scientific Instruments 77, 103709 (2006). and Nov. 6, 2006 issue of Virtual Journal of Nanoscale Science & Technology, http://www.vjnano.org.

* cited by examiner

*Primary Examiner*—Nikita Wells
(74) *Attorney, Agent, or Firm*—Jianq Chyun IP Office

(57) ABSTRACT

An electron microscope suitable for observing at least one sample is provided. The sample has at least one testing area, and a material of the sample on the testing area is semiconductive or conductive. The electron microscope includes a stage, an electron gun, and at least one probe. The stage is suitable for carrying the sample and the sample is not electrically grounded. The electron gun is suitable for generating an electron beam and accumulating charges on the sample. When the probe contacts with the testing area, the image contrast of the testing area will change. The current through the probe will also change upon contact. Methods have been provided based on these principles to determine "when" and "where" the probe starts to contact the sample surface inside an electron microscope.

14 Claims, 4 Drawing Sheets

ELECTRON MICROSCOPE, METHODS TO DETERMINE THE CONTACT POINT AND THE CONTACT OF THE PROBE

CROSS-REFERENCE TO RELATED APPLICATION

This application claims the priority benefit of Taiwan application serial no. 95116721, filed on May 11, 2006. All disclosure of the Taiwan application is incorporated herein by reference.

BACKGROUND OF THE INVENTION

1. Field of the Invention

The present invention is related to a method of determining the contact point and the contact of the probe, and more specifically, to a method of determining the contact of the probe with a sample surface in an electron microscope and a method to locate the contact point.

2. Description of Related Art

When using an electron microscope, one must take two measures at the same time in the current technique in order to manipulate the probe for making the probe tip in contact with the sample surface. First, a very thin and sharp probe is chosen to ensure that the ultimate contact point between the probe and the sample surface falls at the tip during the operation. Second, the probe must maintain an appropriate tilt angle while approaching the sample surface during the operation, allowing the user to monitor the position of the probe tip all the time.

However, since the image of the electron microscope cannot provide quantitative information of the perspective depth of field, whether the probe tip contacts with the sample surface during the operation is only determined by observing whether or not the probe tip begins to slide laterally. That is to say, the moment of time for the probe tip to contact with the sample surface cannot be obtained exactly. Thus, when the probe tip slides laterally, it is likely that the probe tip or the sample surface has been deformed or damaged due to the over-contact. In addition, as the probe with an extremely thin and sharp tip must be very expensive and liable to get damaged in usage, the maintenance cost of the conventional electron microscope with maneuverable probes is increased accordingly. Further, since the sample surface tends to be damaged by the probe, the overall cost for a typical measurement is also increased accordingly.

SUMMARY OF THE INVENTION

An object of the present invention is to provide an electron microscope to eliminate the high maintenance cost due to the damage of the conventional probe and the sample caused by the over-contact between them.

Another object of the present invention is to provide a method of determining the probe contact to avoid the over-contact between the probe and the sample.

Still another object of the present invention is to provide a method to determine the probe contact point for prolonging the service lifetime of the probe and expanding the ways of using the probe.

In order to achieve the above-mentioned or other objectives, the present invention provides an electron microscope suitable for observing at least one sample. The sample has at least one testing area, and the material of the sample on the testing area is semi-conductive or conductive. The electron microscope comprises: a stage, an electron gun and at least one probe. The stage is suitable for carrying the sample and the sample is not electrically grounded. The electron gun is suitable for generating an electron beam and accumulating charges on the sample. When the probe contacts with the testing area, the image contrast of the testing area changes.

In an embodiment of the present invention, the above-mentioned probe is electrically grounded.

In an embodiment of the present invention, the above-mentioned electron microscope further comprises an ammeter, and the probe is electrically grounded via the ammeter.

In an embodiment of the present invention, the above-mentioned electron microscope further comprises an ammeter electrically connected to the probe.

In order to achieve the above-mentioned or other objectives, the present invention further provides a method to determine the probe contact, which is suitable for use in an electron microscope having at least one probe. The method to determine the probe contact comprises: providing at least one sample, wherein the sample has at least one testing area, and the material of the sample on the testing area is semi-conductive or conductive; disposing the sample in the electron microscope, wherein the sample is not electrically grounded; accumulating charges on the sample; and contacting the probe with the testing area, the image contrast of which will change upon contact.

In an embodiment of the present invention, the above-mentioned electron microscope has an electron gun for accumulating charges on the sample.

In an embodiment of the present invention, the above-mentioned probe is electrically grounded.

In an embodiment of the present invention, the above-mentioned electron microscope has an ammeter, and the probe is electrically grounded via the ammeter.

In an embodiment of the present invention, the above-mentioned electron microscope has an ammeter electrically connected to the probe.

In order to achieve the above-mentioned or other objectives, the present invention further provides a method to determine the probe contact point, which is suitable for use in a probe of an electron microscope. The method to determine the probe contact point comprises: providing a sample, wherein the sample has two sets of parallel semi-conductive or conductive strip-shaped testing areas, the common direction of which in one set is different from that in the other by an angle; disposing the sample within the electron microscope, wherein the sample is not electrically grounded; accumulating charges on the sample; contacting the probe with a strip-shaped testing area in the first set, wherein the image contrast of the corresponding strip-shaped testing area in the first set changes upon contact, a first axis at the probe is defined; and contacting the probe with a strip-shaped testing area in the second set, wherein the image contrast of the corresponding strip-shaped testing area in the second set changes upon contact, a second axis at the probe is defined. The crossing point between the second axis and the first axis is the contact point of the probe.

In an embodiment of the present invention, the above-mentioned electron microscope has an electron gun for accumulating charges on the sample.

In an embodiment of the present invention, the above-mentioned probe is electrically grounded.

In an embodiment of the present invention, the above-mentioned electron microscope has an ammeter, and the probe is electrically grounded via the ammeter.

In an embodiment of the present invention, the above-mentioned electron microscope has an ammeter electrically connected to the probe.

As the present invention utilizes the probe to contact with the testing area of the sample which is not electrically grounded, the image contrast of the testing area changes, thereby achieving the object of determining the contact. Therefore, the conventional phenomenon of causing damages to the probe tip and the sample surface due to the over-contact may be eliminated. Besides, the present invention further utilizes the above method for locating the probe contact point without requiring a very thin and sharp probe to be used together with the electron microscope. Therefore, the cost of the probe is reduced and its service lifetime is also prolonged.

In order to make the aforementioned and other objects, features and advantages of the present invention in comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
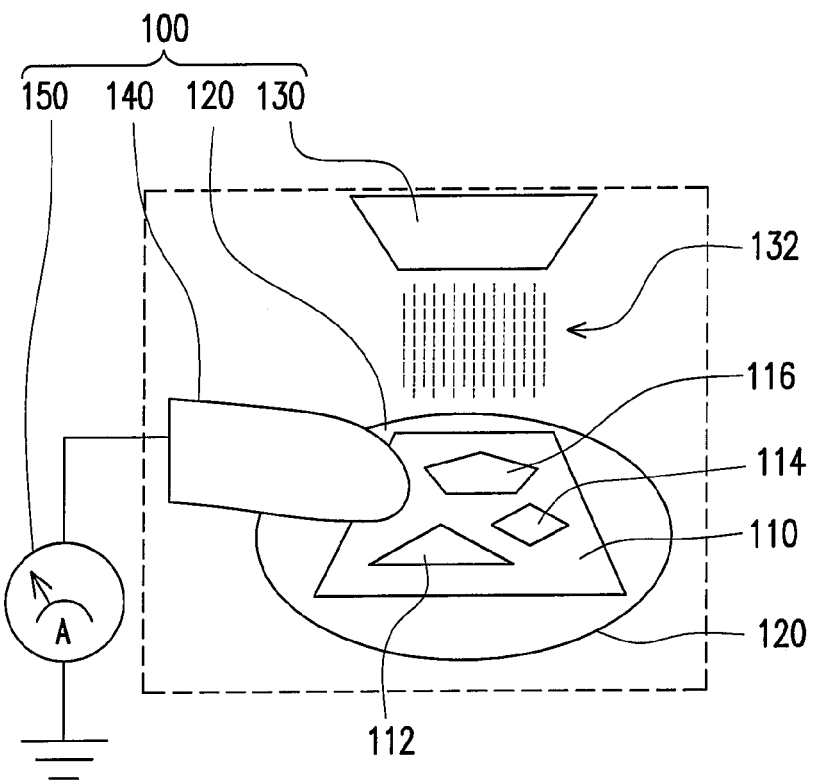
FIGS. 1A-1B are flow charts of the operation of a probe in an electron microscope according to an embodiment of the present invention.
Figure 1B:
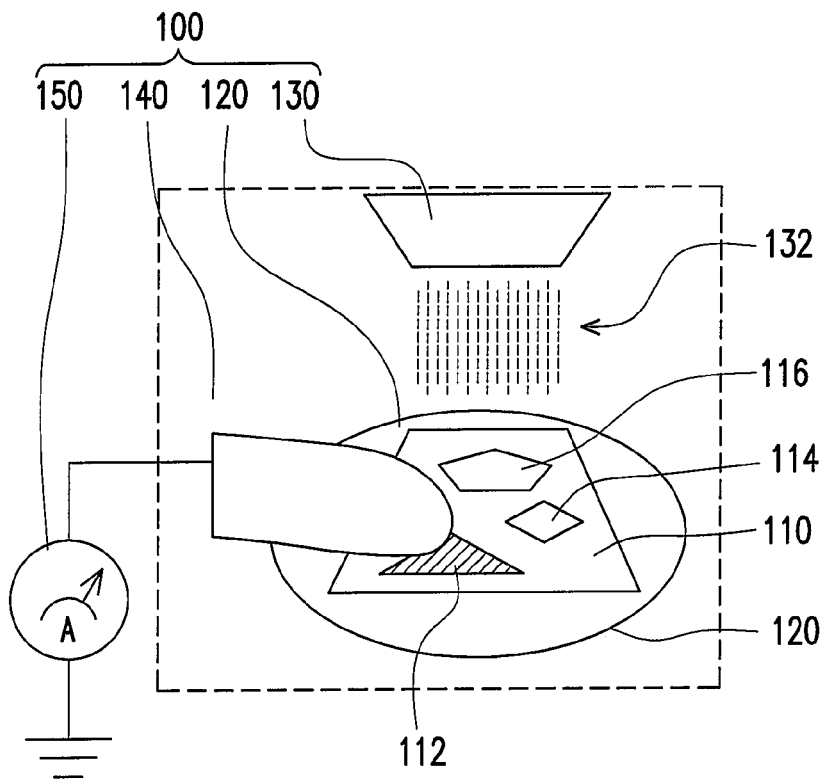

FIGS. 1A-1B are flow charts of the operation of a probe in an electron microscope according to an embodiment of the present invention. Referring to FIGS. 1A-1B, the electron microscope 100 is suitable for observing at least one sample 110. The sample 110 has a plurality of testing areas 112, 114, 116, and the material of the sample 110 on the testing areas 112, 114, 116 is semi-conductive or conductive. The electron microscope 100 comprises: a stage 120, an electron gun 130 and at least one probe 140. The stage 120 is suitable for carrying the sample 110, and the sample 110 is not electrically grounded. In addition, the electron gun 130 is suitable for generating an electron beam 132 to accumulate charges on the sample 110. In this embodiment, the electron microscope 100 further comprises an ammeter 150. The probe 140 is electrically connected to the ammeter 150 and electrically grounded via the ammeter 150.

During the operation, first, the electron gun 130 is used to generate an electron beam 132 to accumulate charges on the testing areas 112, 114, 116 of the sample 110. Next, the probe 140 contacts with one testing area 112 of the sample 110, thus the charges accumulated on the testing area 112 are transferred to the ground terminal via the probe 140 and the ammeter 150 in sequence. Thus, it can be observed via the electron microscope 100 that, the image contrasts of the testing area 112 is different from that of the testing areas 114, 116 (having no contact with the probe 140) due to the different densities of charges accumulated thereon, as shown in FIG. 1B. Therefore, the present invention may make qualitative determination of the moment of time when the probe 140 contacts with the surface of the sample 110 according to the change of image contrast.

Figure 2:
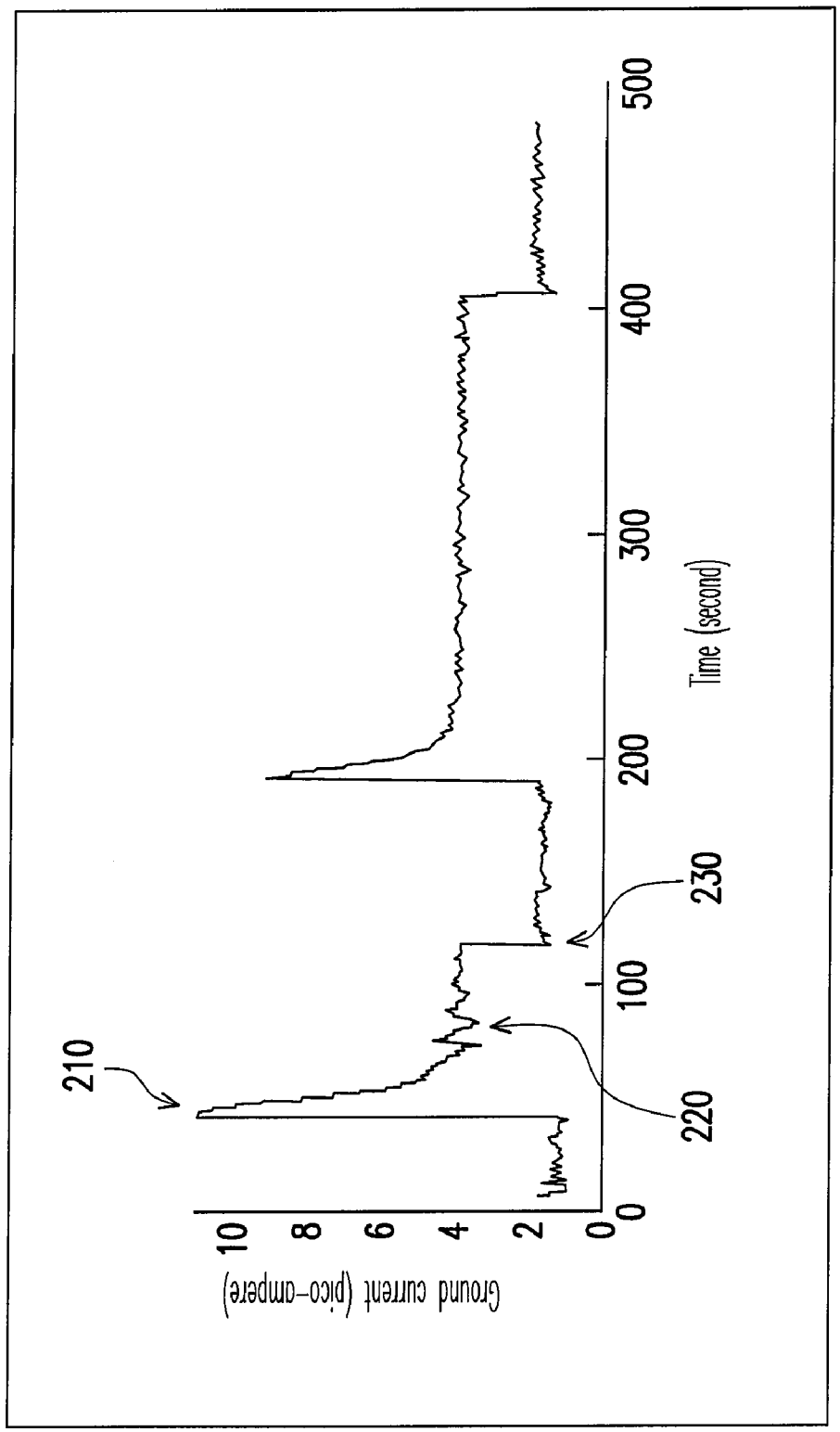
FIG. 2 is a reference graph of the current through the probe to the ground terminal as a function of time for two events of contact.

FIG. 2 is a schematic view of the current through the probe to the ground terminal as a function of time for two events of contact. The Y-coordinate is the magnitude of current through the probe to the ground terminal with pico-ampere as the unit, which is equal to $10^{-12}$ ampere; the X-coordinate is the time with second as the unit. Referring to both FIG. 1B and FIG. 2, when the probe 140 contacts with the testing area 112 of the sample 110, the charges accumulated on the testing area 112 are grounded via the probe 140 and the ammeter 150 in sequence. Consequently, when the charges pass through the ammeter 150, a rising waveform 210 is formed for the reading of the ammeter 150 due to the sudden increase of current, as shown in FIG. 2. While the charges accumulated on the testing area 112 have been gradually reduced due to being grounded, the electron gun 130 still generate the electron beam 132 continuously, resulting in a continuous charge transfer from the testing area 112 to the ground terminal via the probe 140 and the ammeter 150. In other words, as shown in FIG. 2, the magnitude of the current shown on the ammeter 150 has gradually reduced to a stable current 220 as time elapsed. Finally, when the probe 140 is removed from the testing area 112, the reading of the ammeter 150 is also suddenly reduced to form a descending waveform 230 as shown in FIG. 2. Therefore, as shown in FIG. 1B, the present invention not only makes qualitative determination of the time for the probe 140 to contact with the sample 110 through the image contrasts of the testing areas 112, 114, 116, but also makes quantitative determination of the time through the change of the reading on the ammeter 150.

In the above-mentioned embodiment, the probe 140 is electrically grounded via the ammeter 150. However, the present invention is not limited to this embodiment. For example, the ammeter 150 may be replaced by other measuring meters, such as voltmeter, also having the function of quantitative determination. In another embodiment, the probe 140 may be electrically grounded directly without connecting to the ammeter 150, and this embodiment may also utilize the image contrasts of the testing areas 112, 114, and 116 as shown in FIG. 1B to make qualitative determination of the time when the probe 140 contacts with the sample 110. In another embodiment, the probe 140 may not be electrically grounded, but only the changes of the image contrast when the probe 140 contacts with one of the testing areas 112, 114, 116 are utilized to make qualitative determination of the time when the probe 140 contacts with the sample 110. In addition, although this embodiment takes a single sample 110 as an example for illustration, the electron microscope 100 may also be used for observing a set of conductive samples without being electrically connected to each other. Similarly, although this embodiment takes a single probe 140 as an example for illustration, the electron microscope 100 may also be used for observing the contact between a set of probes and the sample at the same time. In addition, although the sample 110 of this embodiment takes a set of testing areas 112, 114, 116 as an example for illustration, the sample 110 having a single testing area may also be used in this embodiment. In addition, the method to determine the probe contact in this embodiment may also be used to measure the contact point of the probe, which is illustrated below in details.

Figure 3A:
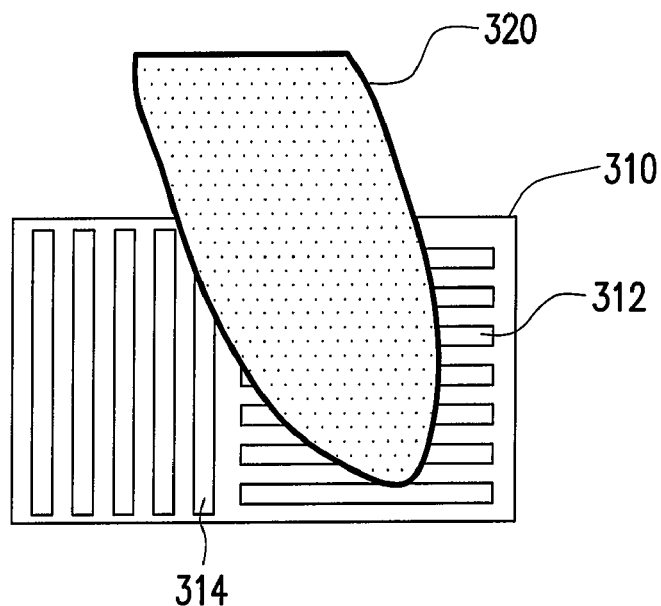
FIGS. 3A-3C are flow charts for locating the probe contact point according to an embodiment of the present invention.
Figure 3B:
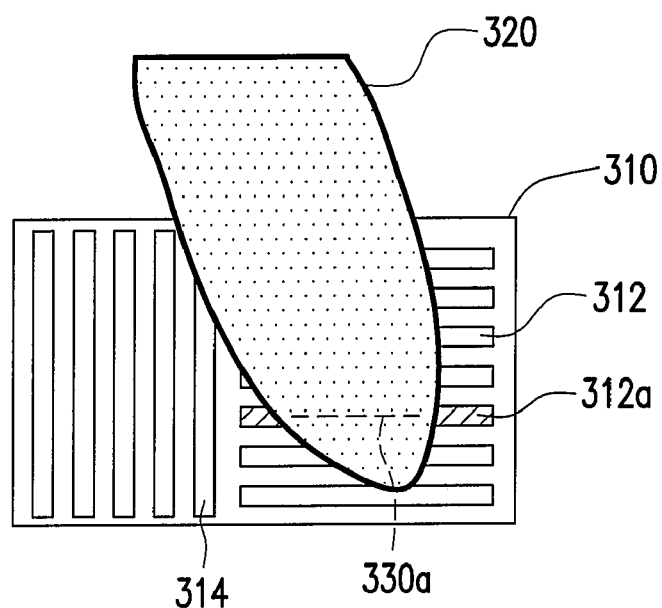
Figure 3C:
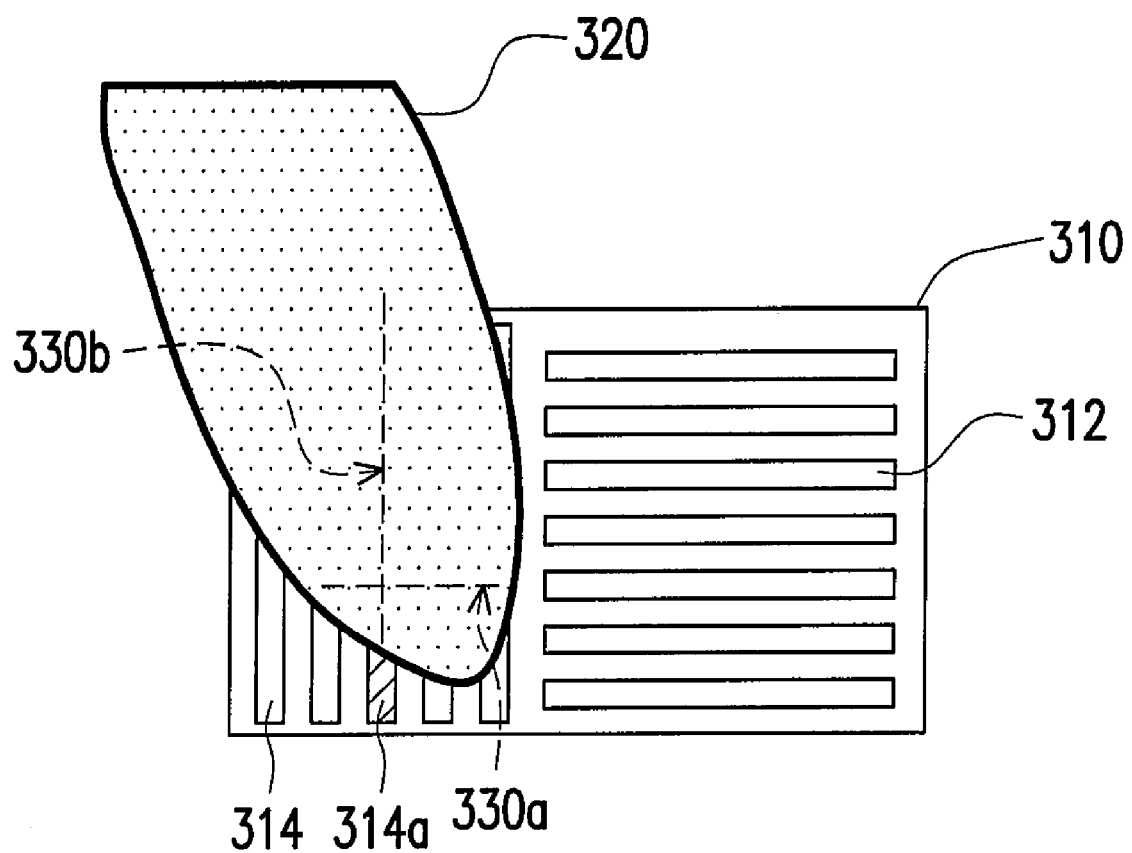

FIGS. 3A-3C are flow charts for locating the probe contact point according to an embodiment of the present invention. Referring to FIG. 3A, a sample 310 is provided, and the sample 310 has the first set of parallel strip-shaped testing areas 312 and the second set of parallel strip-shaped testing areas 314. The material of the sample 310 on the first set of strip-shaped testing areas 312 and the second set of strip-shaped testing areas 314 is semi-conductive or conductive, and the conductive material is preferred. Each strip-shaped testing area in the first set 312 is tilted from each strip-shaped testing area in the second set 314 by an angle, which is 90 degrees in this embodiment, but other degrees of angles is also possible. At this time, the probe 320 does not contact with the sample 310. The sample 310 is first disposed within the electron microscope (not shown), and the sample 310 is not electrically grounded. Then, charges are accumulated on the sample 310 through the above method. Referring to FIG. 3B, when the probe 320 contacts with a strip-shaped conductive part 312a in the first set of strip-shaped testing areas 312, the image contrast of the strip-shaped conductive part 312a changes, allowing us to define the first axis 330a at the probe 320. Then, referring to FIG. 3C, when the probe 320 contacts with a strip-shaped conductive part 314a in the second set of strip-shaped testing areas 314, the image contrast of the strip-shaped conductive part 314a changes, allowing us to define the second axis 330b at the probe 320. The crossing point(s) between the second axis 330b and the first axis 330a is the contact point(s) of the probe 320 with the sample 310. The conventional electron microscope employs a probe with a very thin and sharp tip, which is not only used for determining the contact time, but also used for locating the contact point. However, as the present invention defines the contact point between the probe and the sample, the selection of the probe is no longer limited to the very expensive probe with extremely thin and sharp tip, thereby reducing the cost.

In summary, as the present invention uses the probe to contact with the testing area on the sample, the charges accumulated on the testing areas are transferred to the probe, resulting in a difference between the charges accumulated on this testing area and that accumulated on other testing areas, thereby the image contrasts are also different, allowing us to judge whether the probe contacts with the sample. In other words, not only the use of the very expensive probes with extremely thin and sharp tips is avoided, but also the over-contact between the probe and the sample is avoided, thereby preventing the probe or the sample surface from being damaged. Meanwhile, the present invention further determines whether or not the probe contacts with the sample by measuring the current passing through the probe. Therefore, the present invention is capable of implementing qualitative determination through the image contrast and quantitative determination through the current change at the same time, allowing the user to determine more precisely the moment of time when the probe contacts with the sample.

Besides, the user may locate the contact point of the probe beforehand by using the changes of the image contrast when the probe contacts with a specially patterned sample. Therefore, whether or not the probe is sharp is no longer a problem for determining the contact point, so that the user need not use the very expensive probe with extremely thin and sharp tip, and the service lifetime of the probe is also prolonged. Therefore, the present invention not only reduces the cost of the probe, but also facilitates its performance and maintenance.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An electron microscope suitable for observing at least one sample, wherein the sample has at least one testing area, and a material of the sample on the testing area is semi-conductive or conductive, the electron microscope comprising:
   a stage, suitable for carrying the sample, wherein the sample is not electrically grounded;
   an electron gun, suitable for generating an electron beam to accumulate charges on the sample; and
   at least one probe, wherein when the probe contacts the testing area, the image contrast of the testing area changes.

2. The electron microscope as claimed in claim 1, wherein the probe is electrically grounded.

3. The electron microscope as claimed in claim 2, further comprising an ammeter, and the probe is electrically grounded via the ammeter.

4. The electron microscope as claimed in claim 1, further comprising an ammeter electrically connected to the probe.

5. A method for determining a probe contact, suitable for an electron microscope, wherein the electron microscope has at least one probe, the method comprising:
   providing at least one sample, wherein the sample has at least one testing area, and a material of the sample on the testing area is semi-conductive or conductive;
   disposing the sample in the electron microscope, wherein the sample is not electrically grounded;
   accumulating charges on the sample; and
   contacting the probe with the testing area, wherein the image contrast of the testing area changes when the probe contacts the testing area.

6. The method to determine the probe contact as claimed in claim 5, wherein the electron microscope has an electron gun for accumulating charges on the sample.

7. The method to determine the probe contact as claimed in claim 5, wherein the probe is electrically grounded.

8. The method to determine the probe contact as claimed in claim 7, wherein the electron microscope has an ammeter, and the probe is electrically grounded via the ammeter.

9. The method to determine the probe contact as claimed in claim 5, wherein the electron microscope has an ammeter electrically connected to the probe.

10. A method for determining a probe contact point, suitable for a probe of an electron microscope, comprising:
    providing a sample, wherein the sample has two sets of parallel strip-shaped testing areas, the common direction of which in one set is different from that in the other by an angle, and a material of the sample on the first strip-shaped testing areas and the second strip-shaped testing areas is semi-conductive or conductive;
    disposing the sample in the electron microscope, wherein the sample is not electrically grounded;
    accumulating charges on the sample;
    contacting the probe with one of the first set of strip-shaped testing areas, wherein the image contrast of the corresponding strip-shaped testing area changes upon contact, a first axis at the probe is defined; and
    contacting the probe with one of the second set of strip-shaped testing areas, wherein the image contrast of the corresponding strip-shaped testing area changes upon contact, a second axis at the probe is defined, and the crossing point between the second axis and the first axis is a contact point of the probe.

11. The method to determine the probe contact point as claimed in claim 10, wherein the electron microscope has an electron gun for accumulating charges on the sample.

12. The method to determine the probe contact point as claimed in claim 10, wherein the probe is electrically grounded.

13. The method to determine the probe contact point as claimed in claim 12, wherein the electron microscope has an ammeter, and the probe is electrically grounded via the ammeter.

14. The method to determine the probe contact point as claimed in claim 10, wherein the electron microscope has an ammeters electrically connected to the probe.

* * * * *